United States Patent [19]

Kowalski

[11] E Re. 30,604

[45] Reissued May 5, 1981

[54] REUSABLE FIXTURE FOR AN INTEGRATED CIRCUIT CHIP

[75] Inventor: John L. Kowalski, Phoenix, Ariz.

[73] Assignee: Honeywell Information Systems Inc., Phoenix, Ariz.

[21] Appl. No.: 17,759

[22] Filed: Mar. 5, 1979

Related U.S. Patent Documents

Reissue of:

[64] Patent No.: 4,069,496
Issued: Jan. 17, 1978
Appl. No.: 755,758
Filed: Dec. 30, 1976

[51] Int. Cl.[3] ..... H01L 23/48; H01L 23/02; H02G 13/08; H01R 13/50

[52] U.S. Cl. ..... 357/70; 357/69; 357/74; 174/52 FP; 339/176 MP; 40/361

[58] Field of Search ..... 357/69, 70, 74; 174/52 FP; 339/176 MP; 40/361

[56] References Cited

U.S. PATENT DOCUMENTS

| | | | |
|---|---|---|---|
| 2,292,312 | 8/1942 | Wittel et al. | 357/70 |
| 2,823,478 | 2/1958 | Ostergaard et al. | 357/70 |
| 3,281,976 | 11/1966 | Riedel | 357/70 |
| 3,681,866 | 8/1972 | Loersch | 357/70 |
| 3,808,722 | 5/1974 | Byers et al. | 357/70 |
| 3,878,632 | 4/1975 | Berggren et al. | 357/70 |
| 4,007,479 | 2/1977 | Kowalski | 357/70 |
| 4,062,140 | 12/1977 | Meyer et al. | 357/70 |

*Primary Examiner*—Edward J. Wojciechowicz
*Attorney, Agent, or Firm*—Edward W. Hughes; William W. Holloway, Jr.; Ronald T. Reiling

[57] ABSTRACT

A reusable fixture for a segment of a film strip having a flexible beam lead frame mounted on the segment and an integrated circuit chip bonded to the inner portions of the leads of the lead frame. The fixture is made from an integral laminar layer of a suitable material. The improvements are in providing a plurality of pairs of projections with protuberances which overlie, to a slight degree, the attachment webs of a segment. The fixture is also provided with detachment openings to provide access to the attachment webs which detachment openings facilitate removal of a segment from the fixture.

16 Claims, 6 Drawing Figures

REUSABLE FIXTURE FOR AN INTEGRATED CIRCUIT CHIP

Matter enclosed in heavy brackets [ ] appears in the original patent but forms no part of this reissue specification; matter printed in italics indicates the additions made by reissue.

CROSS REFERENCE TO RELATED APPLICATIONS

The present application is an improvement over the invention disclosed and claimed in the following copending application:

Ser. No. 671,238, filed Mar. 29, 1976 entitled "Fixture for Integrated Circuit Chip" invented by John L. Kowalski, which application is assigned to the same assignee as the present application.

BACKGROUND OF THE INVENTION

1. Field of the Invention

This invention is in the field of devices for holding a segment of a thin strip of material on which has been formed, or to which has been attached, a flexible beam lead and to which lead an integrated circuit (IC) chip is bonded. The fixture, or holder, is dimensioned to hold one segment of a film strip. Once a segment is attached to, or held by, the fixture, the fixture protects the IC chip and its lead frame from being damaged during subsequent manufacturing steps but permits the IC chip and a portion of its lead frame to be removed from the segment while the segment is held by the fixture. To optimize the fixture for automating the mounting of a segment on a reusable fixture and for subsequently removing the segment from the fixture, the fixture is provided with a plurality of pairs of attachment projections having wedge shaped protrusions which protrusions overlie the attachment webs of a segment. The attachment webs are located between the sprocket holes of the segment and adjacent edges of a segment. In addition, the fixture is provided with detachment openings which provide access to the attachment webs to facilitate automating the removal of a segment from the fixture.

2. Description of the Prior Art

The application listed under the heading Cross Reference to Related Applications is believed to be the most relevant prior art. FIGS. 7, 8, 9 and 10 of that application disclose a reusable fixture for a segment of a film strip that retains a segment by the use of projections or lugs which fit within the attachment sprocket holes of a segment. Use of lugs or projections which frictionally engage the handling or attachment sprocket holes has revealed two problems. One is that occassionally that portion of a segment that projects beyond a line joining the outer edges of the handling sprocket holes bends, or curls, enough so that an edge of a segment projects above the surface of the fixture. As a result the segment and its IC are not properly protected by the fixture. A second problem arising from the use of four lugs, or projections, that fit within the four attachment sprocket holes of a segment is that such an arrangement does not lend itself to automating the removal of a segment from such a fixture. Normally a segment is removed from its fixture after the IC chip and part of its lead frame has been removed. The reason this second problem occurs is that the prior art arrangements require more than the theoretical minimum forces to remove a segment from its fixture, which removal forces is substantially more than force needed to mount a segment on a fixture. The reason for this discrepancy is that if an essentially point source of force is applied to the bottom surface of a segment to remove it from such a fixture, the point of application of the force under the prior art fixture cannot be at the center of the attachment sprocket holes the centroid of the edges of the attachment sprocket holes. As a result, one side of each attachment sprocket hole tends to bind against its attachment lug which significantly increases the forces necessary to remove a segment from a fixture in which it is mounted and increases the risk of damage to the chip mounted on the segment if such is the case, and to the fixture.

SUMMARY OF THE INVENTION

The present invention provides reusable fixtures each of which can hold a segment of a strip of film on which an IC chip has been bonded to a lead frame which frame is in turn attached to the segment. An inner portion of the lead frame extends over a window formed in a segment of the film and an integrated circuit chip is bonded to the inner portion of the lead frame. Each fixture is provided with an aperture within which an integrated circuit chip mounted on a segment is located when the segment is properly positioned in the fixture. The thickness of the fixture is chosen so that the IC chip and the portions of the lead frame extending over the window of a segment are within the outermost planar surfaces of the fixture and, thus, are protected from inadvertently being physically damaged during various manufacturing processes. The fixture of this invention is provided with improved means for removably retaining such a segment in the fixture which facilitates automating the process of mounting a segment in a fixture and subsequently removing it; which means also minimize the risk of an edge of a segment projecting beyond the outermost surface of the fixture to subject the segment, the chip mounted on the segment, and the lead frame of the chip to a high risk of damage during various manufacturing steps to which the fixture and the chip are subjected prior to the chip being excised from its segment.

The fixture, as taught by the prior art, is provided with an access opening so that the reference sprocket holes of the film segment are accessible since access to the reference sprocket holes is required to accurately and positively position, or locate, the chip and at least a part of its lead frame prior to their being excised from the fixture. The problems of the prior art fixtures are solved in the present invention by providing a pair of attachment projections, or lugs, at each corner of a recess formed in the fixture which projections are positioned so that one of them will fit within each attachment sprocket hole of a segment with each such projection having a protrusion which overlaps, or overlies, to some degree one side, or edge, of the attachment webs of the segment and the other projection of each pair which is also provided with protrusions which overlies substantially to the same degree the other side, or edge, of the attachment web where each attachment web is located between each of the attachment sprocket holes and the closer boundary edge of a segment. Detachment openings are formed through the fixture between the attachment projections so that a small rod can be inserted through each detachment opening to apply force on the bottom surface of the attachment webs substantially at the centroid, or the center, of each attachment web to remove a segment from its fixture with a minimum amount of force.

It is, therefore, an object of this invention to provide a fixture for a segment of a strip of film with improved means for removably securing a segment to the fixture.

It is a further object of this invention to provide a reusable fixture which is provided with a plurality of pairs of attachment projections between which the attachment webs of a segment fit.

It is a still further object of this invention to provide improved means for removably retaining a segment of a film strip in a fixture which means are located close to the corners of a segment and which requires a minimum of force to be applied to the lower surfaces of the attachment webs of a segment when the segment is removed from a fixture.

BRIEF DESCRIPTION OF THE DRAWINGS

Other objects, features and advantages of the invention will be readily apparent from the following description of a preferred embodiment thereof taken in conjunction with the accompanying drawings, although variations and modifications may be affected without departing from the spirit and scope of the novel concepts of the disclosure, and in which.

DESCRIPTION OF THE PREFERRED EMBODIMENT

Figure 1:
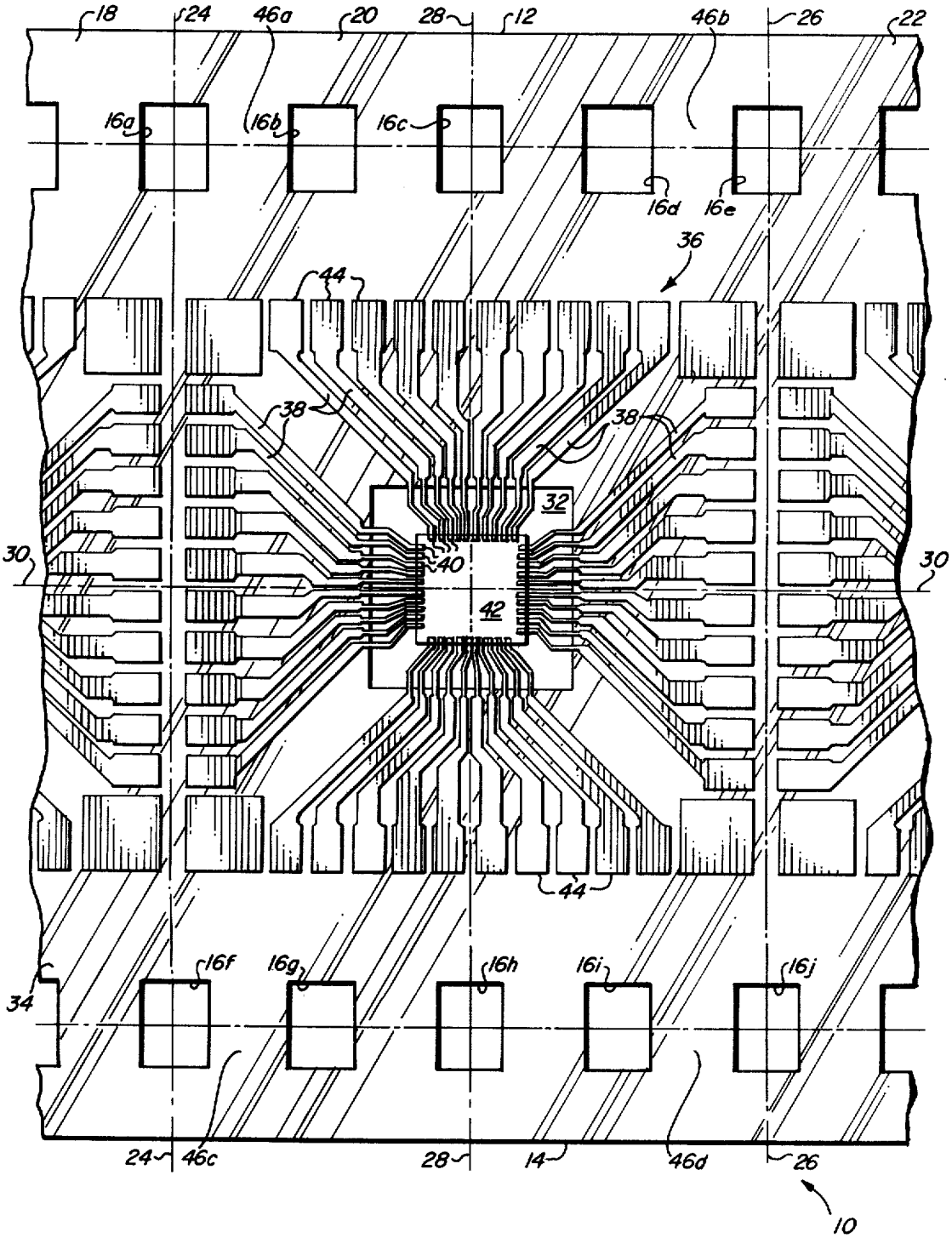
FIG. 1 is a plan view at a greatly enlarged scale of a portion of a strip of film showing details of a segment.

Referring to FIG. 1, film strip, or carrier 10, is made of a flexible material of substantially uniform thickness and having substantially planar upper and lower surfaces. The side edges 12, 14 of strip 10 are substantially parallel. Sprocket holes, or perforations, 16 are formed in two rows which are substantially parallel to and substantially equally spaced from the edges 12 and 14 of film strip 10. The location and size of sprocket holes 16 are precisely controlled. Film strip 10 is divided into a plurality of substantially rectangular segments 18, 20 and 22. The segment boundary lines, or edges, between segments 18, 20 and 22 are indicated by dashed lines 24, 26. In each segment, such as segment 20, one of the sprocket holes, or perforations, such as sprocket hole 16c, which is the center sprocket hole of the upper row, and sprocket hole 16h, which is the center sprocket hole in the lower row, are the reference, or datum, sprocket holes. The centers of holes 16c, 16h determine the Y axis 28 and the X axis 30 of segment 20, since axis 30 is the perpendicular bisector of the line segment determined by the centers of the reference sprocket holes 16c, 16h. Window, or opening 32, is formed in segment 20 of film strip 10 with, in a preferred example, the center of window 32 substantially coinciding with the intersection of axis 28 and 30. While window 32 is illustrated as being square, any suitable shape and dimension appropriate for the size and shape of an integrated circuit chip bonded to the lead frame attached to the segment is suitable.

The upper surface 34 of film strip 10 initially has bonded to it a layer of conductive material such as copper of substantially uniform width and thickness. This layer is normally located only between the rows of sprocket holes 16. Lead frame 36 is preferably formed from this layer by a conventional photoetching process and consists of a plurality of separate conductors, or leads, 38 the inner portions of which are bonded to terminals 40 if IC chip 42. The outer portion of leads 38 of lead frame 36 extend over the window 32 of segment 20.

The outer portion of each lead 38 of lead frame 36 terminates in a test pad 44. The size of pads 44 is chosen so that the probe of a conventional testing device, neither of which are illustrated, can readily make a good electrical contact with pads 44. Thus, it is possible to determine if leads 38 are properly bonded to bumps or terminals 40 on chip 42 and if the electrical characteristics of IC chip 42 meet specifications. Segment 20 is separated from segment 18 and 22 by cutting or slicing film strip 10 at its segment boundary lines, or edges 24, 26. In FIG. 1, it can be seen that the boundary edges 24, 26 substantially pass through the centers of sprocket holes 16a, f, e and j. It should be noted that in the embodiment illustrated, sprocket holes 16b, d, g and the attachment, or handling, sprocket holes of segment 20, are respectively located on either side of the reference, or datum, sprocket holes 16c, 16h. The portions of the film strip 10 between attachment sprocket holes 16b, d, g and i and the nearer of the segment boundaries 24 or 26 are the attachment webs 46a, b, c and d of segment 20.

Figure 2:
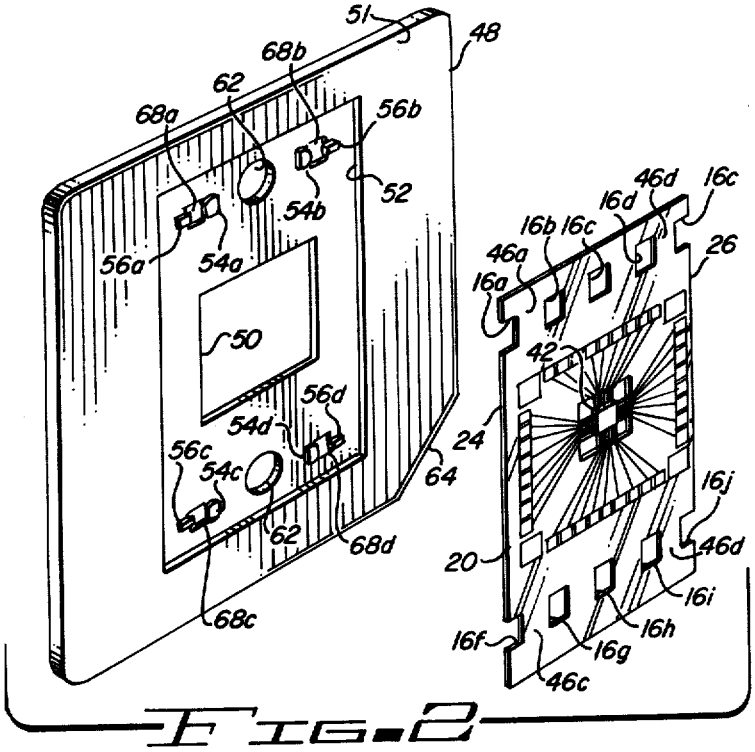
FIG. 2 is an isometric view of the invention with a segment exploded therefrom.
Figure 6:
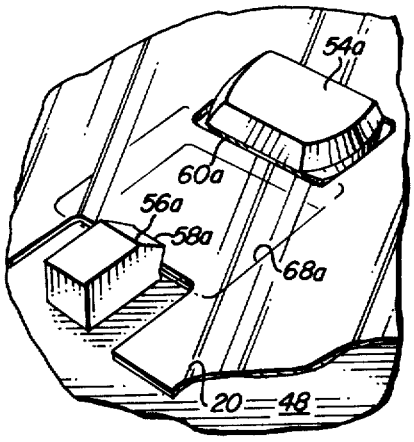
FIG. 6 is a fragmentary isometric view illustrating details of a pair of attachment projections of a fixture.
Figure 3:
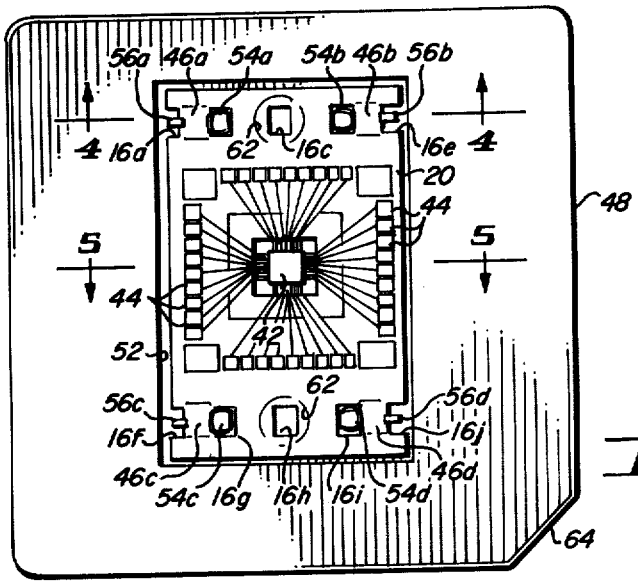
FIG. 3 is a plan view, at an enlarged scale, of the fixture of FIG. 2.
Figure 4:
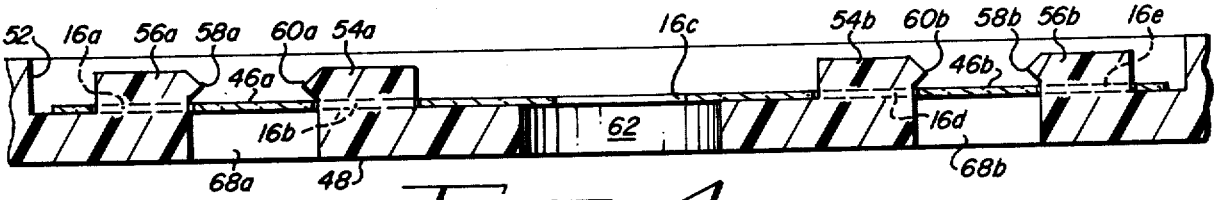
FIG. 4 is an enlarged sectional view taken along the line 4—4 of FIG. 3.

Referring to FIG. 2, fixture 48 is made of a single layer of laminar material. An aperture 50 is formed in fixture 48. In the top surface 51 of fixture 48 a recess 52 is formed around aperture 50, the dimensions of recess 52 are such that a segment of film strip 10, such as segment 20, can readily fit within recess 52. To removably hold, or retain, segment 20 within recess 52, four pairs of cooperating projections, or lugs 54, 56 are formed in recess 52. Lugs 54a, b, c and d are positioned to project through attachment sprocket holes 16b, d, g and i of segment 20. Lugs 56a, b, c and d are located so that a portion of each of their wedge shaped protrusions, or protuberances, 58a, b, c and d extends over, or overlies, a portion of attachment webs 46a, b, c and d in the same manner that the wedge shaped protrusions, or protuberances, 60a, b, c and d of lugs 54a, b, c and d project over or overlie another portion of the attachment webs 46 when segment 20 is mounted in fixture 48. Referring to FIG. 4, it can be seen that a part of protrusion 58b of projection 56b will overlie attachment web 46b of segment 20 as does the protrusion 60b of projection 54b. In similar manner, each pair of projections 54a, 56a; 54b, 56b; 54c, 56c; and 54d, 56d, with their respective protrusions 58a, b, c and d; and 60a, b, c, and d extend over the attachment webs 46a, b, c, and d as is best illustrated in FIG. 3. The dimensions of lugs 54a, b, c and d in the Y direction are such that each will almost contact the two ends of the attachment sprocket holes through which they project to limit movement of a segment in the Y direction.

The distance between a pair of lugs such as 54b, 56b and the sides of the attachment web they overlie such as web 46b is such as to significantly limit the movement of segment 20 in the X dimension. Thus, once the attachment webs of a segment are forced below the protuberances 58, 60 of each pair of lugs 54, 56, to the position illustrated in FIG. 4 substantially no forces are applied to the segment by the retention means, i.e.; the four pairs of retention lugs 54, 56 which are sufficient to distort the portion of lead frame 36 which extends over the window 32 of segment 20.

A pair of circular reference access openings 62 are formed in fixture 48 so that access through the fixture to the datum, or reference, sprocket holes 16c, 16h of segment 20 is possible while the segment 20 is held by fixture 48. One corner of fixture 48 is removed to provide a polarity key 64 which, together with access openings 62, are sufficient to determine the orientation of fixture 48 and thus of segment 20.

A major advantage of fixture 48 is that it is reusable. As a consequence, a significant advantage of using pairs of attachment projections which overlie the attachment webs, each of which attachment webs is in close proximity to one of the four corners of segment 20, is that such a structural arrangement lends itself to automating the step of securing, or mounting, a segment in fixture 48 by simultaneously applying a small force essentially to the center of each of the attachment webs 46a, b, c and d which forces are sufficient to deform the edges of the attachment webs slightly as they pass between the protrusions 58, 60 of each pair of attachment lugs 54, 56. The advantage of applying a force to the center, or centroid, of an attachment web 46 is that the force is applied at substantially an equal distance from the protuberances of the pair of retaining lugs whose protuberance overlie the web, or the distances from the centroid where the force is applied to the protuberances overlying it are substantially equal. Another advantage of using pairs of attachment projections is that the protrusions 58a, b, c and d of projections 56a, b, c and d are closer to the boundary lines or boundary edges 24, 26 of the segment 20 than the closer side, or edges, of attachment sprocket holes 16b, d, g and i so that the width of the portions of segment 20 that is not restrained by lugs 56a, b, c and d along the boundary edges 24, 26 is minimized, which minimizes the risk that any bending, or curling, of segment 10 could cause edge 24 or 26 to project above top surface 51 of fixture 48.

Fixture 48 is also provided with detachment openings 68a, b, c and d which are located between each pair of projection 54, 56 which detachment openings provide access to the bottom surface of attachment webs 46a, b, c and d, respectively. Detachment openings 68a, b, c and d facilitate automating the removal of segment 20 from the fixture 48 since small forces substantially equal to the forces required to attach a segment, such as segment 20, to fixture 48 can be applied, preferably simultaneously, to the bottom surfaces of each of the attachment webs substantially at the centers of these webs. Such forces will readily detach a segment from a fixture without applying undue strain on the lead frame and the chip, assuming they have not previously been excised, and with little risk of damage to fixture 48.

FIG. 3 is a plan view of holder 48 with a segment, such as segment 20, mounted within recess 52 and held in place by four pairs of attachment projections 54a, 56a; 54b, 56b; 54c, 56c; and 54d, 56d which overlie the attachment webs 46a, b, c and d of segment 20 substantially at the four corners thereof. It should be noted that the access holes 62 provide access to the reference sprocket holes 16c, 16h of segment 20.

Figure 5:
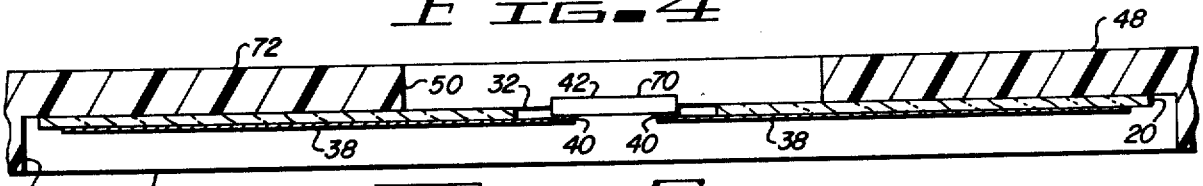
FIG. 5 is an inverted enlarged fragmentary sectional view taken on line 5—5 of FIG. 3.

Referring to FIG. 5, in which fixture 48 is inverted, IC chip 42 projects into the aperture 50 of fixture 48. The thickness of fixture 48 immediately surrounding the aperture 50 is such that the surface 70 of the chip 42 is below the surface 72 of fixture 48 when the fixture is inverted as in FIG. 5 so that chip 42 is protected from potential damage during subsequent maufacturing steps. Recess 52 is of sufficient cepth so that the leads 38 are sufficiently above surface 51 of fixture 48 to protect the leads 38 from damage during subsequent manufacturing steps until chip 42 and part of its leads are excised, normally immediately prior to chip 42 being mounted on a substrate, for example.

As can best be seen in FIG. 3, the test pads 44 and leads 38 of the lead frame 36 are directy accessible so that it is possible to subject chip 42 to electrical tests while the segment 20 is held by fixture 48. Since portions of the fixture 48 underlie pads 44 of the lead frame, it is not necessary to provide any additional physical support for test pads 44 to protect leads 38 from damage during such tests.

The materials from which the fixtures 48 can be made is preferably a moldable thermoplastic such as polyester, polystyrene, polypropylene, polyurethane, or nylon. However, the fixtures of this invention can be made from any suitable similar material.

After a chip 42 has been placed in fixture 48, the chip may be tested and if it is of acceptable quality; the next step in the manufacturing process is to mount the chip on a substrate or place the chip into an appropriate package. To do this, it is necessary to sever chip 42 and part of the leads 38 from segment 20. The places where leads 38 are cut are located within the window 32 of segment 20. During this severing operation, in order for leads 38 to be cut at the proper places, the equipment that performs this function uses the reference sprocket holes 16c, 16h to locate segment 20 properly with respect to the cutting or severing means. Reference sprocket holes 16c, 16h are used whenever a critical operation is to be performed with respect to segment 20. These particular critical steps normally are the forming of a window 32 in a segment, the forming of a lead frame 36 the bonding of an IC chip 42 to-a lead frame 36, testing to determine if the leads are properly bonded to the chip, the testing of the chip itself, and the removal of a chip and a portion of its lead frame preparatory to their being mounted on a substrate or in a package.

From the foregoing, it is apparent that the fixture constituting this invention provides an improved device for holding a segment of a film strip having a lead frame affixed to the strip with an integrated circuit chip or die bonded to the lead frame, which fixture has improved means to facilitate automating the mounting of a segment on a fixture and the removing of a segment from the fixture. The fixture protects the IC chip and its lead frame from being damaged during manufacturing steps between the step of mounting the segment in the holder and the removal of a chip and a portion of its lead frame from a segment preparatory to the chip being mounted on a substrate or in an appropriate package. The fixture permits ready access to die or chip, its lead frame, and the reference sprocket holes of the segment, as well as to the attachment webs of a segment so that the manufacturing process can be automated more economically and with the necessary degree of precision and reliability.

It should be evident that various modifications can be made to the described embodiments without departing from the scope of the present invention.

What is claimed is:

1. A fixture for a substantially rectangular segment of film having substantially planar surfaces and four edges; said segment having a plurality of sprocket holes arranged in two parallel rows are substantially parallel to opposite edges of the segment, one sprocket hole of each row being a datum sprocket hole, and a pair of sprocket holes of each row being attachment sprocket holes; each segment having four attachment webs, each web forming an edge of an attachment sprocket hole and having a centroid; and means forming a window in said segment, said window having a position fixed relative to the datum sprocket holes; said fixture comprising:

a laminar layer;

means forming an aperture in said laminar layer, recess means surrounding said aperture, the dimensions of the recess being such as to receive and position a segment relative to said aperture so that said aperture provides access to the window of a segment positioned in said recess means;

means located in said recess means partially overlying the attachment webs of a segment positioned in said recess means for retaining a segment in the recess means;

means forming access openings in said fixture for providing access to the datum sprocket holes of a segment positioned in said recess means; and means forming detachment openings through said fixture for providing access to the centroids of the attachment webs of a segment positioned in said fixture.

2. The fixture of claim 1 in which the [recess] means for retaining a segment in the recess *means* are pairs of projections, one projection of each pair being adapted to project through an attachment sprocket hole of a segment.

3. The fixture of claim 2 in which each one of the projections of each pair of projections is provided with a protuberance which is adapted to overlie an attachment web of a segment.

4. A fixture for a segment of film having substantially planar surfaces, each segment having a pair of boundary edges and a pair of side edges, each segment having a plurality of sprocket holes arranged in two rows each of which is substantially parallel to the side edges with one sprocket hole of each row being a datum sprocket hole and with the pair of sprocket holes of each row closest to the boundary edges of the segment being attachment sprocket holes, means forming a window in said segment, said window having a position fixed relative to the datum sprocket holes, the portions of a segment between an attachment sprocket hole and its nearer boundary edge being attachment webs with each web having a center; said fixture comprising:

a laminar layer;

means forming an aperture in said laminar layer, recess means surrounding said aperture, the dimensions of the recess being such as to receive a segment and position the segment relative to said aperture so that said aperture provides access to the window in a segment positioned in said recess means;

means located in said recess means overlying the attachment webs of a segment for retaining removably a segment positioned in the recess means;

means forming access openings in said fixture for providing access to the datum sprocket holes of a segment positioned in said recess means; and means forming detachment openings in said fixture for providing access to the centers of the attachment webs of a segment positioned in said fixture.

5. The fixture of claim 4 in which the [recess] means for retaining a segment in the recess *means* of the fixture are pairs of projections, one of each pair being adapted to project through an attachment sprocket hole of a segment.

6. The fixture of claim 5 in which each one of the projections of each pair of projections is provided with a protuberance which proturberances are adapted to overlie partially an attachment web of a segment.

7. A fixture for a segment of film having substantially planar surfaces, each segment having a plurality of edges two of which are boundary edges and two of which are side edges, said segment having two rows of at least three sprocket holes on each side of the segment said rows being substantially parallel to the side edges, one sprocket hole of each row being a datum sprocket hole, a pair of sprocket holes not including the datum sprocket hole of each row which are closest to the boundary edges being attachment sprocket holes, the portion of the segment between an attachment sprocket hole and an edge of the segment being attachment webs; means forming a window in said segment, said window having a predetermined position relative to the datum sprocket holes; said fixture comprising:

a laminar layer;

means forming an aperture in said laminar layer, recess means surrounding said aperture, the dimensions of the recess being such as to receive a segment and properly position the segment relative to said aperture;

projection means located in said recess adapted to partially overlie the attachment webs of a segment for holding a segment in the recess;

means forming access openings in said fixture for providing access to the datum sprocket holes of a segment properly positioned in the recess; and means forming detachment openings in said fixture for providing access to the attachment webs of a segment properly positioned in the recess.

8. The fixture of claim 7 in which the projection means are a pair of projections, one projection of each pair which is adapted to project through an attachment sprocket hole of a segment, and in which each projection of each pair of projections has a protuberance which is adapted to overlie partially an attachment web of a segment.

9. The fixture of claim 8 in which the means forming detachment openings are located between each pair of projections of the projection means.

10. In combination:

a substantially rectangular segment of a film strip having four edges, two of which are boundary edges; and two of which are side edges;

a plurality of sprocket holes formed in two rows, each row being substantially parallel to the side edges, one sprocket hole of each row being a reference sprocket hole and a pair of sprocket holes of each row being attachment sprocket holes, said attachment sprocket holes being the sprocket holes in each row nearest a boundary edge of the segment, a plurality of attachment webs, each web being a portion of the segment between an attachment sprocket hole and the nearer boundary edge and having a centroid;

a window formed in each segment, said window having a predetermined position with respect to the reference sprocket holes;

a lead frame having a plurality of leads, said leads having inner and outer portions, the outer portions of the leads being secured to the segment and the inner portions extending over the window;

an integrated circuit chip attached to the inner portions of at least some leads so that the chip is positioned substantially within the window of the segment;

a fixture for the segment said fixture comprising a laminar layer;

means forming an aperture in said laminar layer;

means forming a recess in said laminar layer surrounding said means forming an aperture, the dimensions of the recess being such as to receive and position a segment so that the window of the segment is accessible through the aperture in the fixture, said segment being positioned in said segment;

means in said recess for overlying partially the attachment webs of the segment to removably retain a segment in said recess; and means forming openings in said laminar layer to provide access to the reference sprocket holes of the segment and the centroids of the attachment webs of a segment positioned and retained in said recess.

11. The combination of claim 10 in which the means for overlying the attachment webs are a plurality of pairs of attachment projections integral with said laminar layer, one of the projections of each pair projecting through an attachment sprocket hole, each of said attachment projections of each pair of attachment projections having a wedge shaped protuberance which extends over the attachment web of segment mounted in said fixture.

12. In combination:

a substantially rectangular film strip, said segment having a pair of side edges and a pair of boundary edges, sprocket holes formed in two rows of at least three sprocket holes in each row parallel to the side edges, one sprocket hole of each row being a reference sprocket hole and a pair of sprocket holes of each row being attachment sprocket holes; said attachment sprocket holes being the sprocket holes in each row nearer the boundary edges of the segment, the portions of the segment between each attachment sprocket hole and the closer boundary edge being an attachment web, a window formed in each segment, said window having a predetermined position with respect to the reference sprocket holes;

a lead frame having a plurality of holes, said leads having inner and outer portions, the outer portions of the leads being secured to the segment and the inner portions extending over the window;

an integrated circuit chip attached to the inner portions of at least some leads so that the chip is positioned substantially within the window of the segment;

a fixture for the segment said fixture comprising a laminar layer;

means forming an aperture in said laminar layer;

means forming a recess in said laminar layer surrounding said means forming an aperture the dimensions of the recess being such as to receive and position a segment so that the window of the segment is accessible through the aperture in the fixture said segment being positioned in said segment;

a plurality of pairs of projections formed integrally with the fixture positioned to overlap partially the four attachment webs of said segment, to maintain the segment in said recess;

means forming openings in said laminar layer to provide access to the reference sprocket holes of the segment; and means forming detachment openings located between each of the pairs of projections the attachment webs of a segment positioned and retained in said recess.

13. In combination of claim 12 in which one of each of a pair of projections projects through an attachment sprocket hole and has a wedge shaped protrusion which overlaps the attachment web.

*14. A fixture for a substantially rectangular segment of film having substantially planar surfaces and four edges; said segment having a plurality of sprocket holes arranged in two parallel rows which rows are substantially parallel to opposite edges of the segment, at least a pair of sprocket holes of each row being attachment sprocket holes; each segment having at least four attachment webs, each web forming an edge of an attachment sprocket hole and having a centroid; said fixture comprising:*

*a laminar layer;*

*means forming an aperture in said laminar layer,*

*recess means surrounding said aperture, the dimensions of the recess being such as to receive and position a segment relative to said aperture so that said aperture provides access to the segment positioned in said recess means;*

*means located in said recess means for partially overlying the attachment webs of a segment positioned in said recess means for retaining a segment in the recess means; and*

*means forming detachment openings through said fixture for providing access to the centroids of the attachment webs of a segment positioned in said fixture.*

*15. The fixture of claim 14 in which the means located in said recess means for partially overlying the attachment webs of a segment are pairs of projections, one projection of each pair being adapted to project through an attachment sprocket hole of a segment.*

*16. The fixture of claim 15 in which each one of the projections of each pair of projections is provided with a protuberance which is adapted to overlie an attachment web of a segment.*

* * * * *